(12) United States Patent
Chen et al.

(10) Patent No.: US 9,201,472 B2
(45) Date of Patent: Dec. 1, 2015

(54) ROTARY MECHANISM AND ELECTRONIC DEVICE THEREOF

(71) Applicant: Wistron Corporation, New Taipei (TW)

(72) Inventors: Kuang-Wen Chen, New Taipei (TW); Chun-Chiang Lai, New Taipei (TW); Yu-Hsin Huang, New Taipei (TW); Fu-Chien Chen, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 281 days.

(21) Appl. No.: 13/889,322

(22) Filed: May 7, 2013

(65) Prior Publication Data

US 2014/0192503 A1   Jul. 10, 2014

(30) Foreign Application Priority Data

Jan. 9, 2013   (TW) .............................. 102100724 A

(51) Int. Cl.
*G06F 1/18* (2006.01)
*H05K 7/14* (2006.01)

(52) U.S. Cl.
CPC ................ *G06F 1/183* (2013.01); *G06F 1/187* (2013.01); *H05K 7/14* (2013.01)

(58) Field of Classification Search
CPC ............ G06F 1/183; G06F 1/187; H05K 7/14
USPC .......... 361/728, 730, 752, 755, 807, 809, 810
See application file for complete search history.

(56) References Cited

U.S. PATENT DOCUMENTS

| | | | |
|---|---|---|---|
| 6,349,029 B1 * | 2/2002 | Leman ...................... | G06F 1/18 16/221 |
| 7,257,827 B2 * | 8/2007 | Lee ....................... | G11B 33/022 312/223.2 |
| 7,532,465 B2 * | 5/2009 | Chen ....................... | G06F 1/187 361/679.33 |
| 8,054,621 B2 * | 11/2011 | Chang ..................... | G06F 1/187 248/221.11 |
| 8,550,414 B2 * | 10/2013 | Chen ..................... | G11B 33/124 248/27.1 |
| 8,955,926 B2 * | 2/2015 | Gong ..................... | G06F 1/187 312/223.2 |

(Continued)

FOREIGN PATENT DOCUMENTS

TW           415550 U   * 11/2011

OTHER PUBLICATIONS

TWM415550U_MT.pdf.*

(Continued)

*Primary Examiner* — Adrian S Wilson
*Assistant Examiner* — Abhishek Rathod
(74) *Attorney, Agent, or Firm* — Winston Hsu; Scott Margo

(57) ABSTRACT

A rotary mechanism includes a supporter and a bracket. The supporter includes a body, a pivot hole structure and a guiding portion. The pivot hole structure and the guiding portion are disposed on the body. A slot is formed on the pivot hole structure. A top of the guiding portion is a cam structure. The bracket pivots to the supporter. The bracket includes a frame, a constraining portion and a pivoting portion. A bottom of the frame contacts against the guiding portion and slides relative to the cam structure. The constraining portion and the pivoting portion are disposed on the frame. The constraining portion can contact against the body to constrain rotation of the bracket relative to the supporter. The pivoting portion slidably pivots to the slot. The pivoting portion moves along the slot to contact the constraining portion against the body.

16 Claims, 8 Drawing Sheets

(56) References Cited

U.S. PATENT DOCUMENTS

| | | | | |
|---|---|---|---|---|
| 2004/0075979 | A1* | 4/2004 | Wang | G06F 1/187 361/679.31 |
| 2006/0061956 | A1* | 3/2006 | Chen | G11B 33/124 361/679.4 |
| 2006/0120033 | A1* | 6/2006 | Zhang | G06F 1/187 361/679.39 |
| 2007/0058333 | A1* | 3/2007 | Kim | G06F 1/187 361/679.59 |
| 2012/0056515 | A1* | 3/2012 | Chen | H05K 7/1487 312/223.2 |
| 2012/0281351 | A1* | 11/2012 | Chen | G06F 1/187 361/679.37 |

OTHER PUBLICATIONS

Office action mailed on May 22, 2015 for the Taiwan application No. 102100724, filing date: Jan. 9, 2013, p. 1 line 11-14, p. 2-3 and p. 4 line 1-16.

* cited by examiner

ROTARY MECHANISM AND ELECTRONIC DEVICE THEREOF

BACKGROUND OF THE INVENTION

1. Field of the Invention

The present invention relates to a rotary mechanism and an electronic device thereof, and more particularly, to a rotary mechanism capable of utilizing its own weight to actuate fixing function and an electronic device thereof.

2. Description of the Prior Art

A conventional computer host utilizes a metal bracket to fix the electronic component, such as the optical disk driver and the hard disk driver. The electronic component can be assembled with and disposed inside the casing of the computer host via the rotary folding mechanism. Further, disassembly of the electronic component from the casing can be operated easily by the rotary folding mechanism. However, the conventional rotary folding mechanism does not have function of rotation constraint. When the rotary folding mechanism rotates out of the casing for replacement of the electronic component, the rotary folding mechanism may fall down accidentally and results in damage of the electronic component. Therefore, design of the rotary mechanism capable of fixing the rotation angle to increase operational safety when assembling and disassembling the electronic component is an important issue in the related computer mechanical design industry.

SUMMARY OF THE INVENTION

The present invention provides a rotary mechanism capable of utilizing its own weight to actuate fixing function and an electronic device thereof for solving above drawbacks.

According to the claimed invention, a rotary mechanism for fixing a position of an electronic component relative to a base in a rotatable manner is disclosed. The rotary mechanism includes a supporter and a bracket pivoting to the supporter. The supporter includes a body, a pivot hole structure and a guiding portion. The body is disposed on the base. The pivot hole structure is disposed on a side of the body, and a slot is formed on the pivot hole structure. The guiding portion is disposed on the body, and a top of the guiding portion is a cam structure. The bracket includes a frame, a constraining portion and a pivoting portion. The frame is for holding the electronic component. A bottom of the frame contacts against the guiding portion to slide relative to the cam structure. The constraining portion is disposed on an edge of the frame adjacent to the supporter. The constraining portion contacts against the body to constrain rotation of the bracket relative to the supporter. The pivoting portion is disposed on a side of the frame and slidably pivoting to the slot on the pivot hole structure. The pivoting portion moves along the slot so that the constraining portion contacts against the body.

According to the claimed invention, the supporter further includes a fixing hole structure disposed on the other side of the body relative to the pivot hole structure. The bracket further includes a pivot axle disposed on the other side of the frame relative to the pivoting portion, and the pivot axle pivots to the fixing hole structure.

According to the claimed invention, the slot includes a first end and a second relative to each other. The pivoting portion pivots to the first end to adjust an angle between the bracket and the supporter. The pivoting portion further moves from the first end to the second end so that the constraining portion contacts against the body.

According to the claimed invention, the cam structure includes a first area and a second area. A curvature of the first area is a constant value, and a curvature of the second area is substantially different from the curvature of the first area.

According to the claimed invention, the cam structure further includes a resilient arm disposed on the second area. The resilient arm holds the frame when the frame slides relative to the second area.

According to the claimed invention, the bracket further includes a guiding pin disposed on the constraining portion. The supporter further includes a guiding slot structure disposed on an edge of the body adjacent to the constraining portion. The guiding pin slidably contacts against the guide slot structure when the bracket pivots relative to the supporter.

According to the claimed invention, the constraining portion is a protrusion formed on a surface of the frame.

According to the claimed invention, the guiding portion is a supporting bar. A structural direction of the slot is substantially parallel to a structural direction of the supporting bar.

According to the claimed invention, an electronic device includes a base and a rotary mechanism rotatably disposed on the base. The rotary mechanism includes a supporter and a bracket pivoting to the supporter. The supporter includes a body, a pivot hole structure and a guiding portion. The body is disposed on the base. The pivot hole structure is disposed on a side of the body, and a slot is formed on the pivot hole structure. The guiding portion is disposed on the body, and a top of the guiding portion is a cam structure. The bracket includes a frame, a constraining portion and a pivoting portion. The frame is for holding the electronic component. A bottom of the frame contacts against the guiding portion to slide relative to the cam structure. The constraining portion is disposed on an edge of the frame adjacent to the supporter. The constraining portion contacts against the body to constrain rotation of the bracket relative to the supporter. The pivoting portion is disposed on a side of the frame and slidably pivoting to the slot on the pivot hole structure. The pivoting portion moves along the slot so that the constraining portion contacts against the body.

The rotary mechanism of the present invention utilizes the cam structure to control a rotating path of the bracket relative to the supporter, to ensure that the pivoting portion of the bracket can suspend above the first end (the upper end) of the slot, so that the constraining portion does not dislocate relative to the body and the bracket can rotate unrestrictedly. As the bottom of the frame moves from the first area to the second area of the cam structure, the cam structure does not hold the frame due to the curvature variation. The bottom of the frame can slide along the second area downwardly to shift the rotary center, for example, the pivoting portion can move from the first end to the second end of the slot, and the constraining portion is dislocated relative to the body with movement of the falling bracket, so that the rotary mechanism can utilize the structural interference between the constraining portion and the body to prevent the rotation of the bracket relative to the supporter. Besides, the bracket can be lifted to recover the rotary mechanism to the position that the rotary mechanism is parallel to the base; in the meantime, the constraining portion is separated from the body to release the structural interference, the pivoting portion moves from the second end to the first end of the slot with the movement of the lifting bracket. Thus, the bracket can rotate into the base to rapidly complete assembly of the electronic component.

Comparing to the prior art, the present invention can economize an amount of components of the rotary mechanism, and provide the automatic constraining function for the bracket. The rotary mechanism and the related electronic device of the present invention can be automatically locked to prevent the collapse when the bracket rotates to the predetermined angle, so as to effectively increase the operation convenience and to advance the assembly efficiency for smoothly fabricating procedures.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
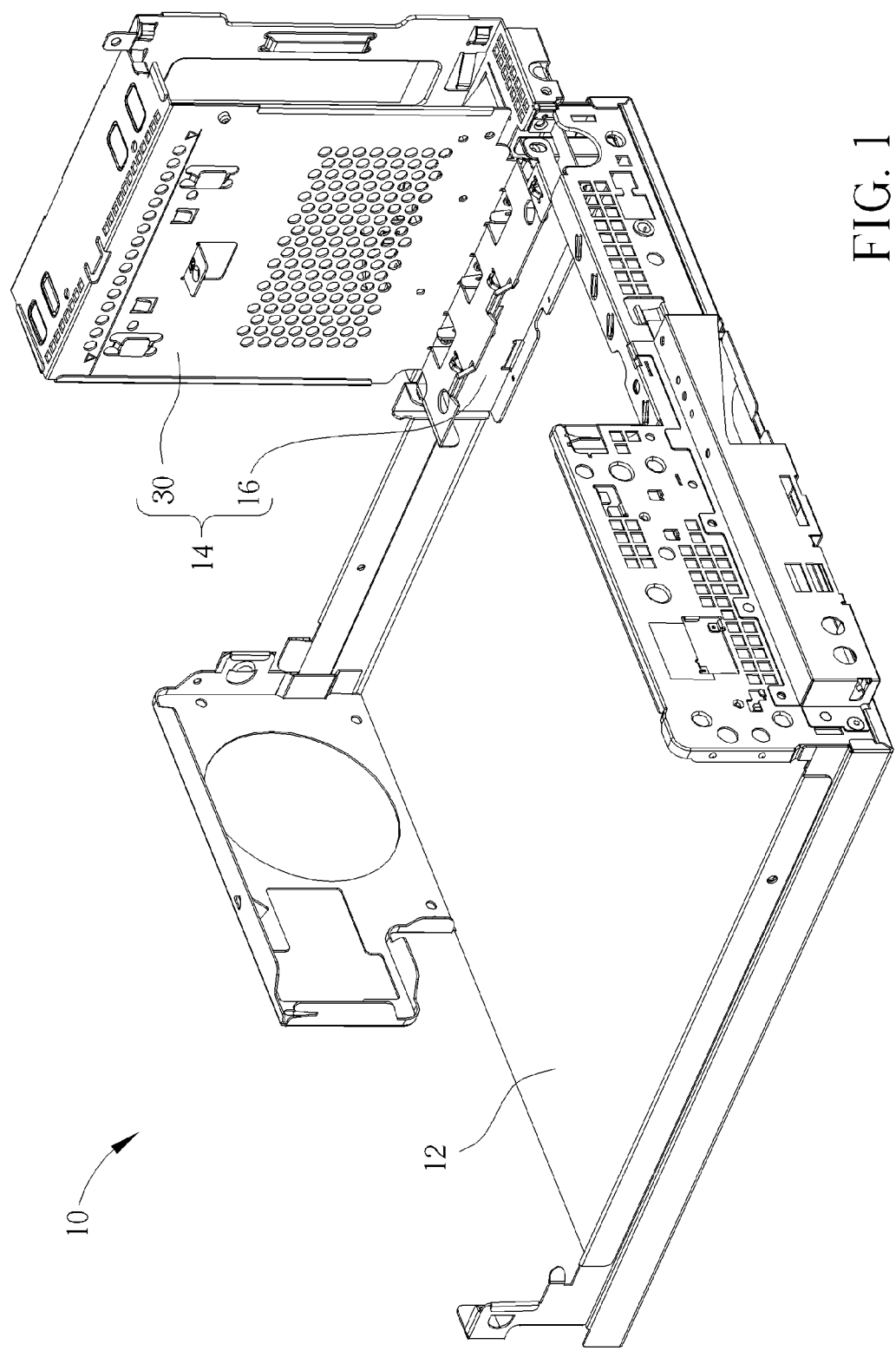
FIG. 1 is a diagram of an electronic device according to an embodiment of the present invention.

Please refer to FIG. 1. FIG. 1 is a diagram of an electronic device 10 according to an embodiment of the present invention. The electronic device 10 can be a server system whereinside a plurality of electronic components is disposed. The electronic component can be an optical disk driver or a hard disk driver. The electronic device 10 includes a base 12 and at least one rotary mechanism 14. The rotary mechanism 14 can be rotatably disposed on the base 12, and the electronic component is disposed inside the rotary mechanism 14. For assembly and disassembly of the electronic component, the rotary mechanism 14 can be moved away from the base 12 in a rotatable manner to conveniently replace the electronic component. The rotary mechanism 14 of the present invention can automatically constrain rotation to prevent accidental collapse when the rotary mechanism 14 drives the electronic component to rotate at a predetermined angle, such as 90 degrees, so as to effectively advance convenience and safety of the operation.

Figure 2:
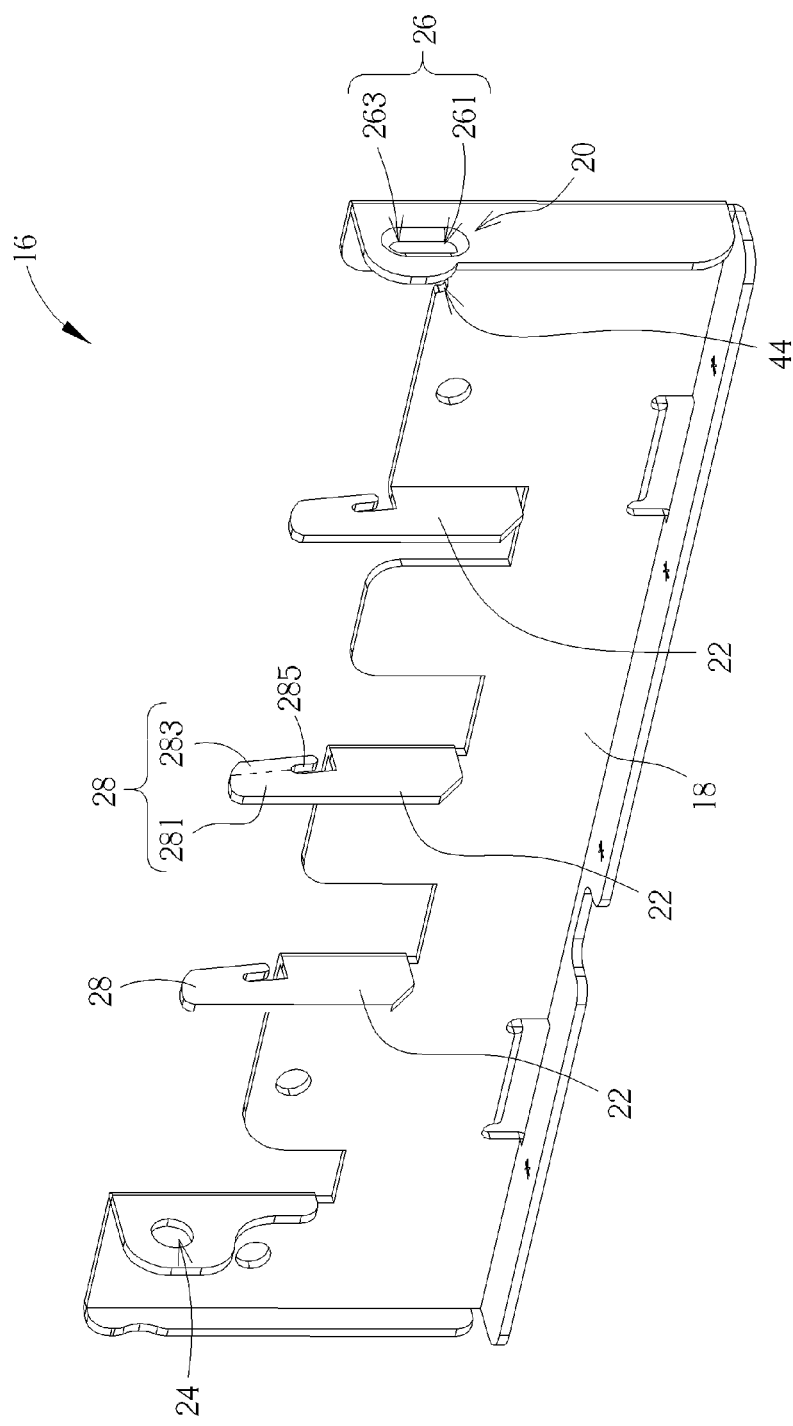
FIG. 2 is a diagram of a supporter according to the embodiment of the present invention.

The rotary mechanism 14 includes a supporter 16 for bridging the rotary mechanism 14 and the base 12. Please refer to FIG. 2. FIG. 2 is a diagram of the supporter 16 according to the embodiment of the present invention. The supporter 16 includes a body 18, a pivot hole structure 20, a plurality of guiding portions 22 and a fixing hole structure 24. The body 18 is fixed on the base 12. The pivot hole structure 20 is disposed on a side of the body 18, and the fixing hole structure 24 is disposed on the other side of the body 18 relative to the pivot hole structure 20. A slot 26 can be formed on the pivot hole structure 20, and the slot 26 includes a first end 261 and a second end 263 opposite to each other. The guiding portion 22 is disposed on the body 18 and located between the pivot hole structure 20 and the fixing hole structure 24. A top of the guiding portion 22 can be a cam structure 28.

Figure 3:
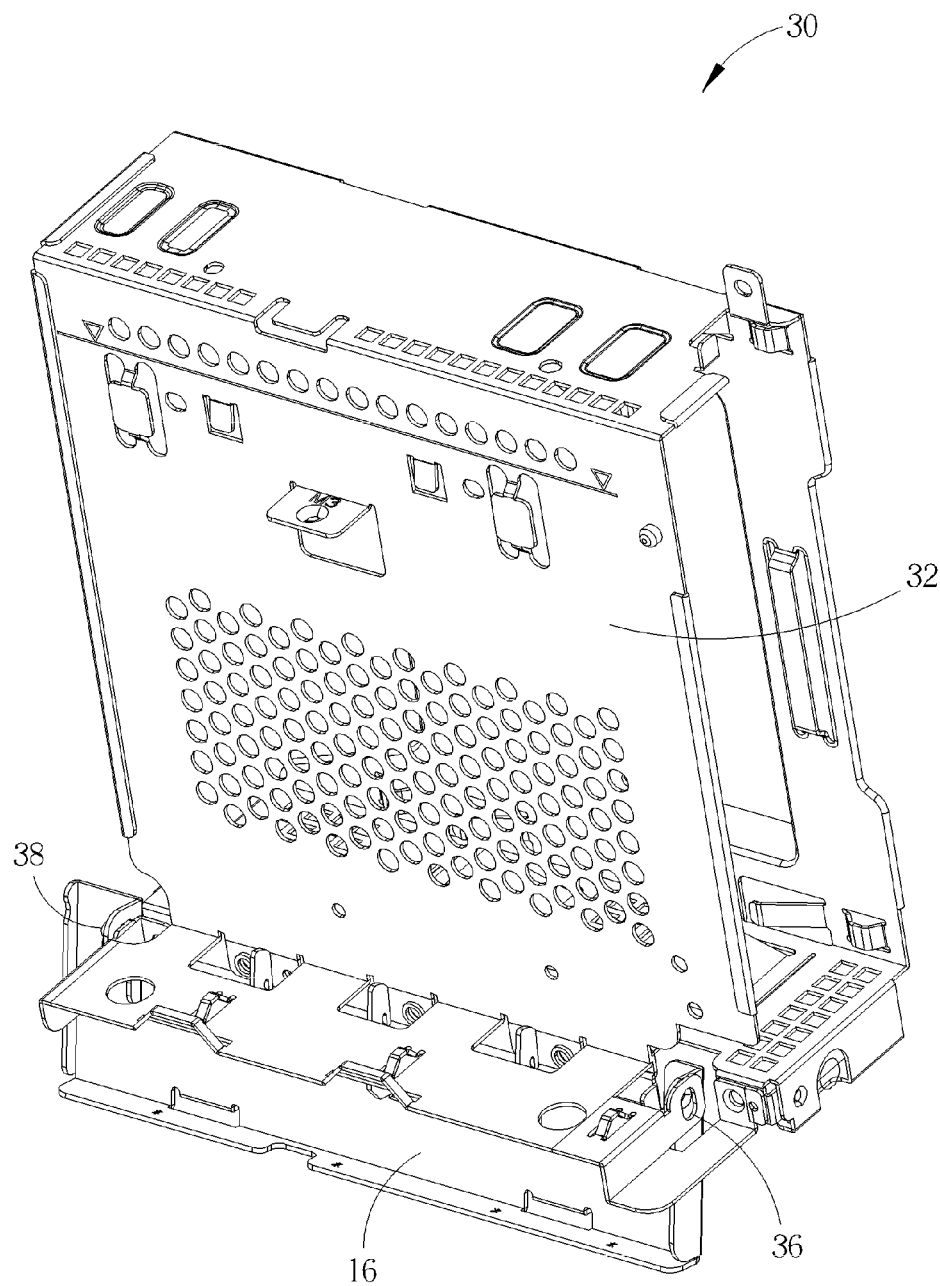
FIG. 3 and FIG. 4 respectively are assembly diagrams of the supporter and a bracket in different views according to the embodiment of the present invention.
Figure 4:
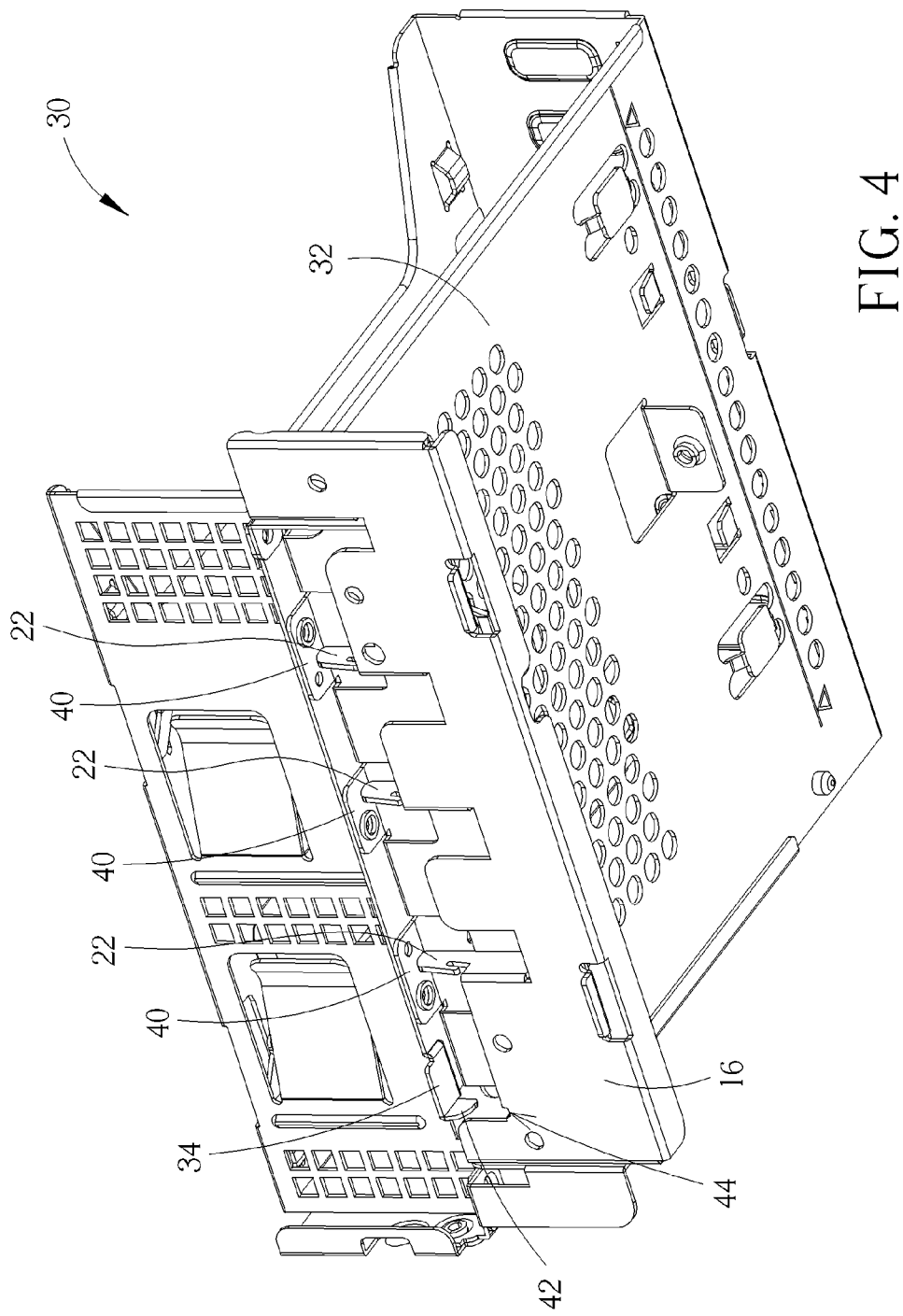

The rotary mechanism 14 further includes a bracket 30 pivoting to the supporter 16. Please refer to FIG. 2 to FIG. 4. FIG. 3 and FIG. 4 respectively are assembly diagrams of the supporter 16 and the bracket 30 in different views according to the embodiment of the present invention. The bracket 30 is utilized to hold the electronic component. The bracket 30 includes a frame 32, a constraining portion 34, a pivoting portion 36 and a pivot axle 38. The electronic component is disposed on the frame 32. When the bracket 30 rotates relative to the supporter 16, a bottom 40 of the frame 32 contacts against the guiding portion 22 to slide relative to the cam structure 28. The constraining portion 34 is disposed on an edge of the frame 32 adjacent to the supporter 16. When the rotary mechanism 14 rotates to the predetermined angle, the constraining portion 34 can contact against the body 18 to constrain rotation of the bracket 30 relative to the supporter 16. The pivoting portion 36 and the pivot axle 38 are respectively disposed on two sides of the frame 32. The pivoting portion 36 slidably pivots into the slot 26 on the pivot hole structure 20, and the pivot axle 38 pivots inside the fixing hole structure 24.

It should be mentioned that the cam structure 28 can include a first area 281 and a second area 283, as shown in FIG. 2. The second area 283 is connected by a side of the first area 281. A curvature of the first area 281 is a constant value, and a curvature of the second area 283 is substantially different from the curvature of the first area 281. When the bottom 40 of the frame 32 slides relative to the cam structure 28 and moves from the first area 281 to the second area 283, the bracket 30 can fall down along an outer edge of the second area 283 due to a weight of the bracket 30 and curvature variation between the two areas, so that the constraining portion 34 can contact against the body 18 for rotation constraint. Generally, the curvature of the second area 283 can be greater than the curvature of the first area 281. In addition, the cam structure 28 can further include a resilient arm 285 disposed on the second area 283. When the frame 32 moves along the second area 283, the resilient arm 285 can hold the frame 32 to slow down drop of the frame 32.

As shown in FIG. 4, the bracket 30 can further include a guiding pin 42 disposed on the constraining portion 34. The supporter 16 can further include a guiding slot structure 44 disposed on an edge of the body 18 adjacent to the constraining portion 34. The guiding pin 42 can be an arc structure. When the bracket 30 pivots relative to the supporter 16, the guiding pin 42 (the arc structure) can contact against the guiding slot structure 44 to relatively slide, so as to hold the bracket 30 for ensuring that a rotary center of the pivoting portion 36 inside the slot 26 is immovable. Further, the constraining portion 34 and the guiding pin 42 can be protrusions formed on a surface of the frame 32 for preferred structural strength. The constraining portion 34 can effectively hold the rotation of the bracket 30 relative to the supporter 16, and the guiding pin 42 can stably hold the bracket 30 to prevent the collapse of the bracket 30.

Figure 5:
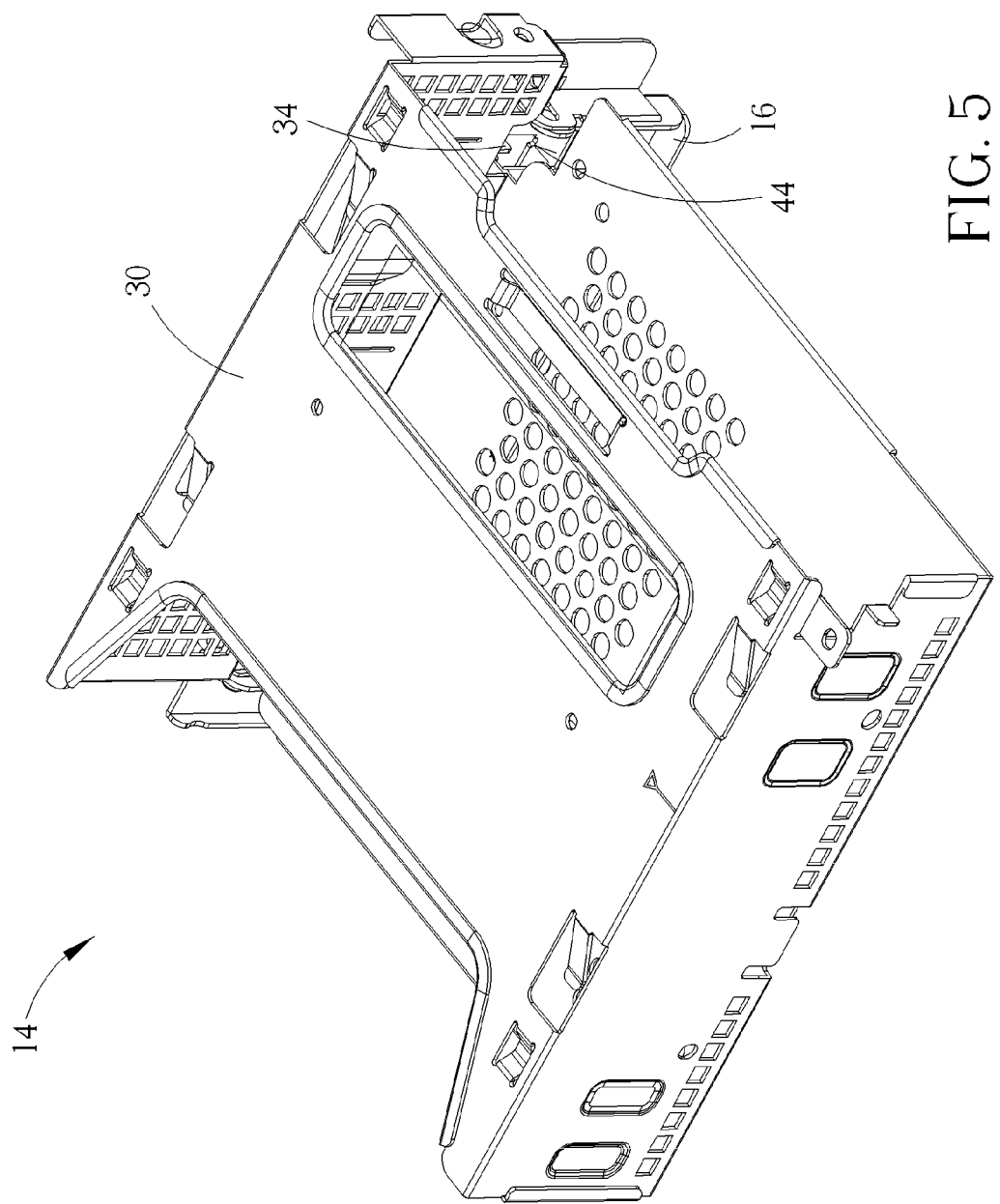
FIG. 5 to FIG. 7 respectively are diagrams of a rotary mechanism in different operation modes according to the embodiment of the present invention.
Figure 6:
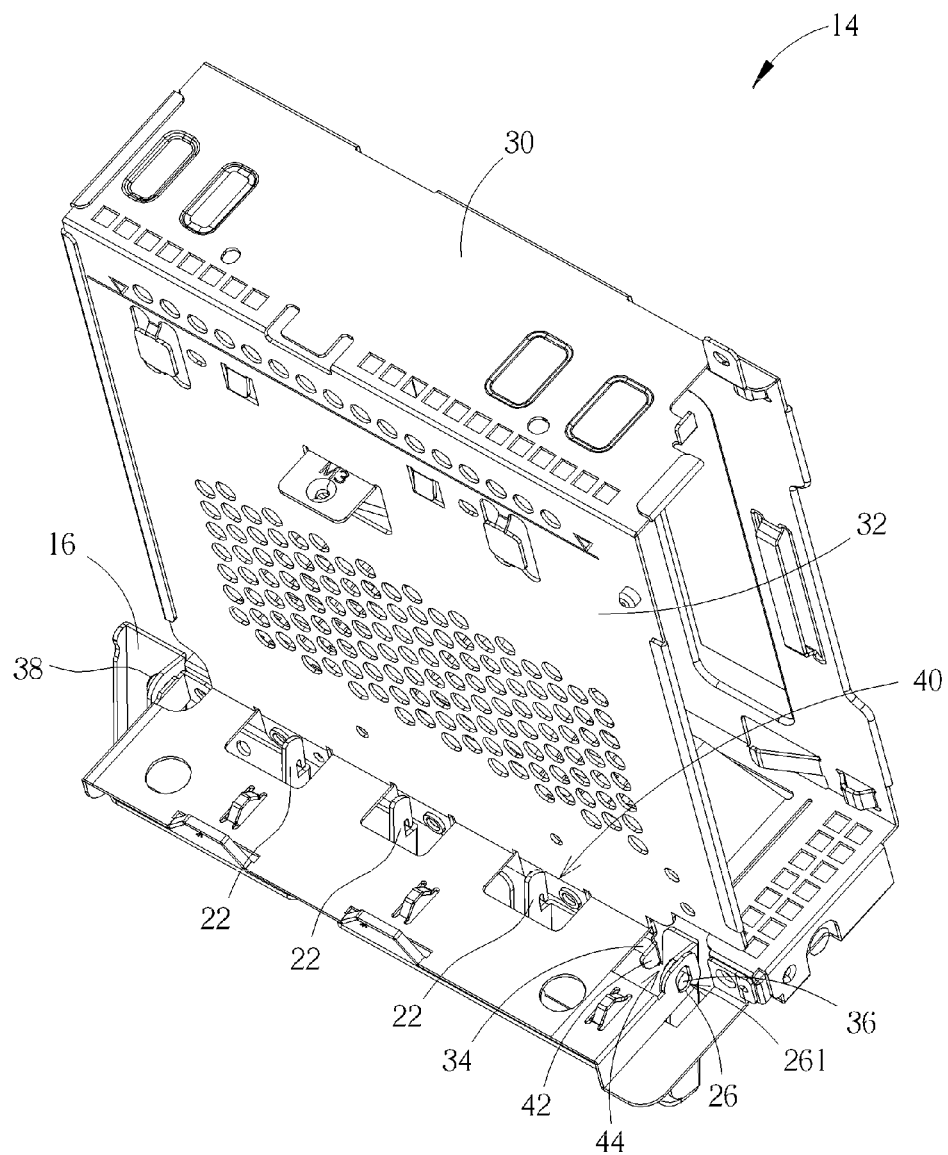
Figure 7:
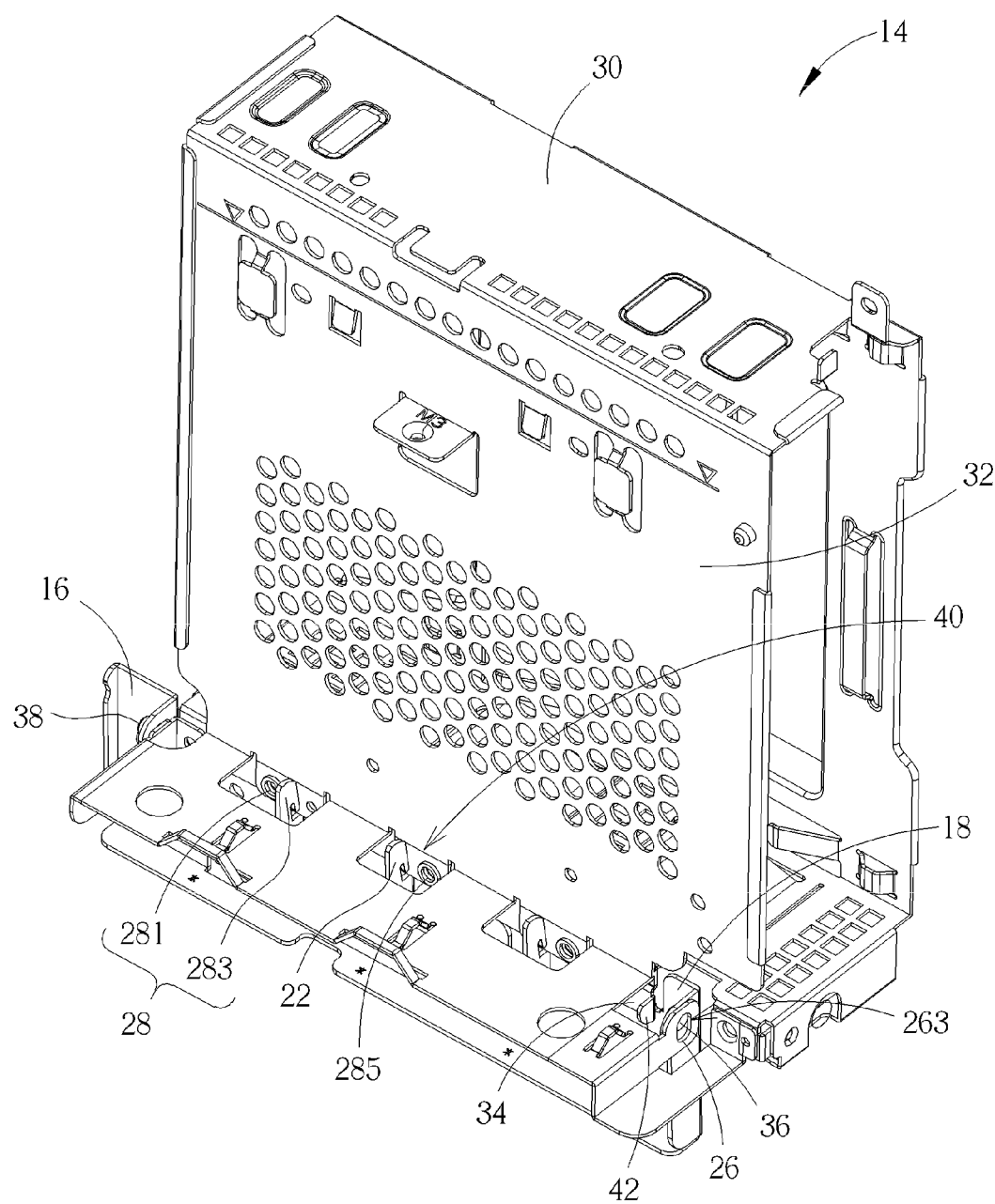

Please refer to FIG. 2 to FIG. 7. FIG. 5 to FIG. 7 respectively are diagrams of the rotary mechanism 14 in different operation modes according to the embodiment of the present invention. As shown in FIG. 5, the bracket 30 is parallel to the base 12, and an angle between the bracket 30 and the base 12 can be zero degree. Meanwhile, the pivoting portion 36 of the bracket 30 is located at the first end 261 of the slot 26 on the supporter 16, the cam structure 28 of the guiding portion 22 contacts against the bottom 40 of the frame 32, and the constraining portion 34 and the guiding pin 42 do not contact the body 18 and the guiding slot structure 44 of the supporter 16.

For disassembly of the electronic component, the bracket 30 can upwardly rotate relative to the base 12, as shown in FIG. 6, and the angle between the bracket 30 and the base 12 can be 80 degrees preferably. The pivoting portion 36 revolves on the first end 261 of the slot 26 to adjust the angle between the bracket 30 and the supporter 16. When the bracket 30 rotates from 0 degree to 80 degrees via the rotary center formed by the pivoting portion 36 and the pivot axle 38, the bottom 40 of the frame 32 can slide along the first area 281 of the cam structure 28. Because the curvature of the first area 281 is constant, position of the pivoting portion 36 inside the pivot hole structure 20 can be immovable, which means the pivoting portion 36 can be stably located at the first end 261. In addition, the guiding pin 42 with the arc structure can contact against the guiding slot structure 44 in a relatively slidable manner, so as to hold the bracket 30 to prevent the rotary center of the bracket 30 from shift.

As shown in FIG. 6 and FIG. 7, when the bracket 30 rotates relative to the base 12 from 80 degrees to 90 degrees, the bottom 40 of the frame 32 can be separated from the first area 281 and then move into the second area 283 of the cam structure 28. The curvature of the second area 283 is different from the curvature of the first area 281, so that the guiding portion 22 can not be a supporting bar to hold the bracket 30 stably. Because a structural direction of the slot is substantially parallel to a structural direction of the supporting bar, the bottom 40 of the frame 32 can downwardly slide along the second area 283, which means the resilient arm 285 is compressed to generate resilient deformation, and the deformed resilient arm 285 can prevent the frame 32 from sudden falling relative to the cam structure 28.

Figure 8:
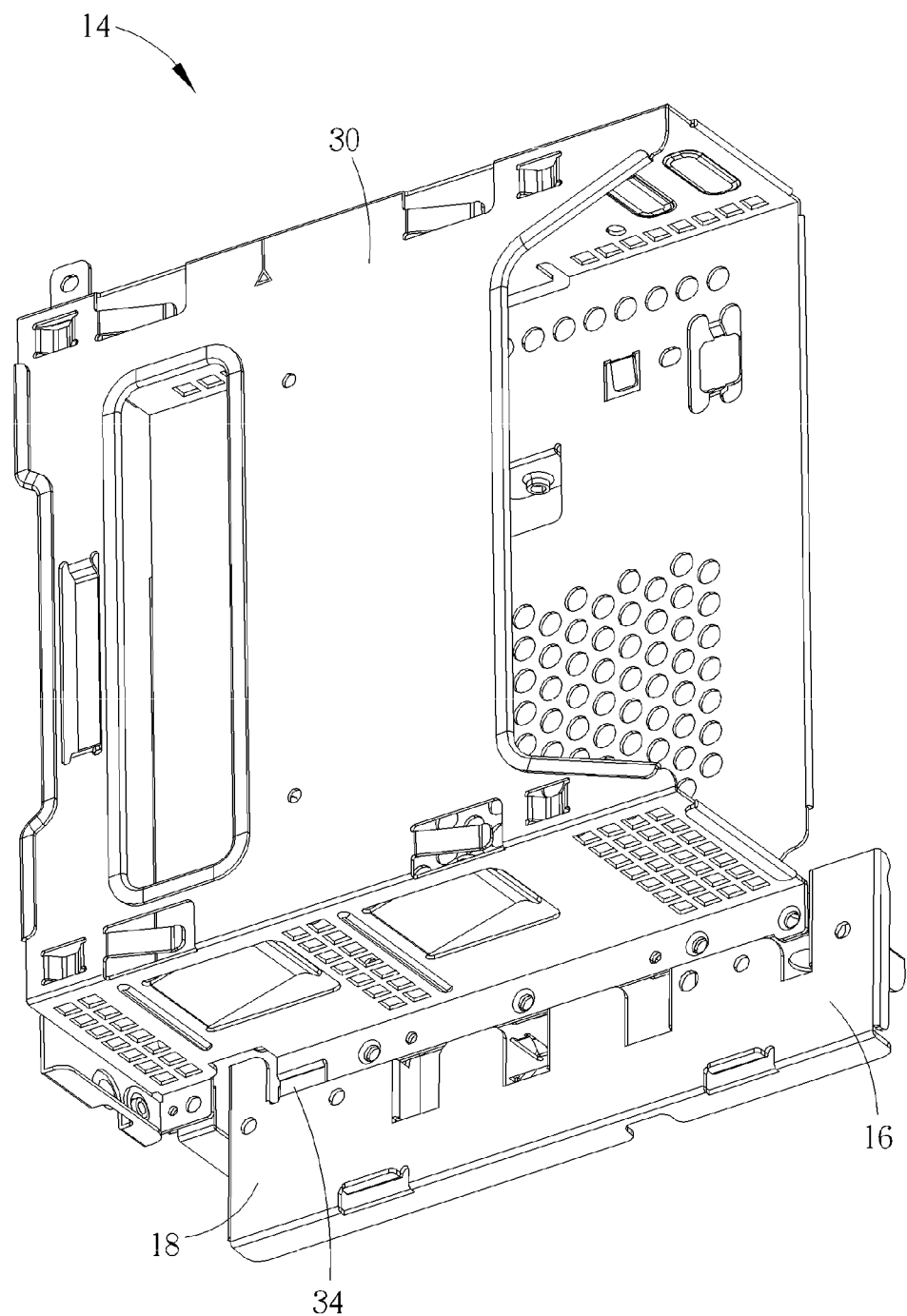
FIG. 8 is a diagram of the rotary mechanism in the other view angle shown in FIG. 7.

Therefore, the bracket 30 falls due to the own weight, and the pivoting portion 36 of the bracket 30 can move from the first end 261 to the second end 263 of the slot 26, so that the constraining portion 34 contacts against the body 18 to utilize structural interference to constrain the rotary mechanism 14 from moving to the position that the rotary mechanism 14 is parallel to the base 12. Please refer to FIG. 8. FIG. 8 is a diagram of the rotary mechanism 14 in the other view angle shown in FIG. 7. As shown in FIG. 8, the constraining portion 34 can contact against the lateral surface of the body 18 by relatively structural dislocation of the body 18. The constraining portion 34 can be a stopper to prevent the rotation of the bracket 30 relative to the supporter 16.

In conclusion, the rotary mechanism of the present invention utilizes the cam structure to control a rotating path of the bracket relative to the supporter, to ensure that the pivoting portion of the bracket can suspend above the first end (the upper end) of the slot, so that the constraining portion does not dislocate relative to the body and the bracket can rotate unrestrictedly. As the bottom of the frame moves from the first area to the second area of the cam structure, the cam structure does not hold the frame due to the curvature variation. The bottom of the frame can slide along the second area downwardly to shift the rotary center, for example, the pivoting portion can move from the first end to the second end of the slot, and the constraining portion is dislocated relative to the body with movement of the falling bracket, so that the rotary mechanism can utilize the structural interference between the constraining portion and the body to prevent the rotation of the bracket relative to the supporter. Besides, the bracket can be lifted to recover the rotary mechanism to the position that the rotary mechanism is parallel to the base; in the meantime, the constraining portion is separated from the body to release the structural interference, the pivoting portion moves from the second end to the first end of the slot with the movement of the lifting bracket. Thus, the bracket can rotate into the base to rapidly complete assembly of the electronic component.

Comparing to the prior art, the present invention can economize an amount of components of the rotary mechanism, and provide the automatic constraining function for the bracket. The rotary mechanism and the related electronic device of the present invention can be automatically locked to prevent the collapse when the bracket rotates to the predetermined angle, so as to effectively increase the operation convenience and to advance the assembly efficiency for smoothly fabricating procedures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rotary mechanism for fixing a position of an electronic component relative to a base in a rotatable manner, the rotary mechanism comprising:
   a supporter, the supporter comprising:
      a body disposed on the base;
      a pivot hole structure disposed on a side of the body, a slot being formed on the pivot hole structure, the slot comprising a first end and a second end opposite to each other; and
      a guiding portion disposed on the body, a top of the guiding portion being a cam structure; and
   a bracket pivoting to the supporter, the bracket comprising:
      a frame for holding the electronic component, a bottom of the frame contacting against the guiding portion to slide relative to the cam structure;
      a pivoting portion disposed on a side of the frame and slidably pivoting to the slot on the pivot hole structure, the pivoting portion being adapted to rotate around the second end while the bottom slides above the cam structure; and
      a constraining portion disposed on an edge of the frame adjacent to the supporter, the pivoting portion being adapted to fall from the second end to the first end in an elongated direction of the slot while the bottom slides across the cam structure, so as to contact the constraining portion against the body to constrain rotation of the bracket relative to the supporter.

2. The rotary mechanism of claim 1, wherein the supporter further comprises a fixing hole structure disposed on the other side of the body relative to the pivot hole structure, the bracket further comprises a pivot axle disposed on the other side of the frame relative to the pivoting portion, and the pivot axle pivots to the fixing hole structure.

3. The rotary mechanism of claim 1, wherein the pivoting portion pivots to the first end to adjust an angle between the bracket and the supporter, the pivoting portion further moves from the first end to the second end so that the constraining portion contacts against the body.

4. The rotary mechanism of claim 1, wherein the cam structure comprises a first area and a second area, a curvature of the first area is a constant value, and a curvature of the second area is substantially different from the curvature of the first area.

5. The rotary mechanism of claim 4, wherein the cam structure further comprises a resilient arm disposed on the second area, the resilient arm holds the frame when the frame slides relative to the second area.

6. The rotary mechanism of claim 1, wherein the bracket further comprises a guiding pin disposed on the constraining portion, the supporter further comprises a guiding slot structure disposed on an edge of the body adjacent to the constraining portion, the guiding pin slidably contacts against the guide slot structure when the bracket pivots relative to the supporter.

7. The rotary mechanism of claim 1, wherein the constraining portion is a protrusion formed on a surface of the frame.

8. The rotary mechanism of claim 1, wherein the guiding portion is a supporting bar, and a structural direction of the slot is substantially parallel to a structural direction of the supporting bar.

9. An electronic device comprising:
a base; and
a rotary mechanism rotatably disposed on the base, the rotary mechanism comprising:
  a supporter, the supporter comprising:
    a body disposed on the base;
    a pivot hole structure disposed on a side of the body, a slot being formed on the pivot hole structure, the slot comprising a first end and a second end opposite to each other; and
    a guiding portion disposed on the body, a top of the guiding portion being a cam structure; and
  a bracket pivoting to the supporter, the bracket comprising:
    a frame for holding the electronic component, a bottom of the frame contacting against the guiding portion to slide relative to the cam structure;
    a pivoting portion disposed on a side of the frame and slidably pivoting to the slot on the pivot hole structure, the pivoting portion being adapted to rotate around the second end while the bottom slides above the cam structure; and
    a constraining portion disposed on an edge of the frame adjacent to the supporter, the pivoting portion being adapted to fall from the second end to the first end in an elongated direction of the slot while the bottom slides across the cam structure, so as to contact the constraining portion against the body to constrain rotation of the bracket relative to the supporter.

10. The electronic device of claim 9, wherein the supporter further comprises a fixing hole structure disposed on the other side of the body relative to the pivot hole structure, the bracket further comprises a pivot axle disposed on the other side of the frame relative to the pivoting portion, and the pivot axle pivots to the fixing hole structure.

11. The electronic device of claim 9, wherein the pivoting portion pivots to the first end to adjust an angle between the bracket and the supporter, the pivoting portion further moves from the first end to the second end so that the constraining portion contacts against the body.

12. The electronic device of claim 9, wherein the cam structure comprises a first area and a second area, a curvature of the first area is a constant value, and a curvature of the second area is substantially different from the curvature of the first area.

13. The electronic device of claim 12, wherein the cam structure further comprises a resilient arm disposed on the second area, the resilient arm holds the frame when the frame slides relative to the second area.

14. The electronic device of claim 9, wherein the bracket further comprises a guiding pin disposed on the constraining portion, the supporter further comprises a guiding slot structure disposed on an edge of the body adjacent to the constraining portion, the guiding pin slidably contacts against the guide slot structure when the bracket pivots relative to the supporter.

15. The electronic device of claim 9, wherein the constraining portion is a protrusion formed on a surface of the frame.

16. The electronic device of claim 9, wherein the guiding portion is a supporting bar, and a structural direction of the slot is substantially parallel to a structural direction of the supporting bar.

* * * * *